(12) United States Patent
Ma et al.

(10) Patent No.: US 8,647,737 B2
(45) Date of Patent: Feb. 11, 2014

(54) METHOD FOR FABRICATION OF CRACK-FREE CERAMIC DIELECTRIC FILMS

(75) Inventors: Beihai Ma, Naperville, IL (US); Uthamalingam Balachandran, Willowbrook, IL (US); Sheng Chao, Greensburg, PA (US); Shanshan Liu, Naperville, IL (US); Manoj Narayanan, Woodridge, IL (US)

(73) Assignee: UChicago Argonne, LLC, Chicago, IL (US)

( * ) Notice: Subject to any disclaimer, the term of this patent is extended or adjusted under 35 U.S.C. 154(b) by 98 days.

(21) Appl. No.: 13/250,926

(22) Filed: Sep. 30, 2011

(65) Prior Publication Data

US 2013/0084444 A1    Apr. 4, 2013

(51) Int. Cl.
| | |
|---|---|
| *B32B 7/02* | (2006.01) |
| *B05D 5/12* | (2006.01) |
| *B05D 3/02* | (2006.01) |
| *H01G 4/06* | (2006.01) |

(52) U.S. Cl.
USPC .......... 428/216; 427/79; 427/372.2; 427/379; 427/380; 361/321.1

(58) Field of Classification Search
None
See application file for complete search history.

(56) References Cited

U.S. PATENT DOCUMENTS

| 5,198,269 A | 3/1993 | Swartz | |
|---|---|---|---|
| 2010/0073845 A1* | 3/2010 | Suh et al. | 361/303 |
| 2010/0302706 A1* | 12/2010 | Ma et al. | 361/321.1 |

OTHER PUBLICATIONS

U. Balachandran, et al., Development of PLZT dielectrics on base metal foils for embedded capacitors, J. Euro. Cerram. Soc. 30(2) (2010), pp. 365-368.
M. Narayanan, et al., Improved dielectric properties of lead lanthanum zirconate titanate thin films on copper substrates, Mater. Lett. 64 (1) (2010), pp. 22-24.
H. Kozuka, et al., Single-Step Deposition of Gel-Derived Lead Zirconate Titanate Films Critical Thickness and Gel Film to Ceramic Film Conversion, Am. Ceram. Soc., 85 (11) (2002), pp. 2696-2702.
H. Kozuka, et al., Single-Step Dip Coating of Crack-Free BaTi3 Films >1 micron Thick: Effect of Poly (vinypyrrolidone) on Critical Thickness, J. Am. Ceram. Soc. 83(5), (2000), pp. 1056-1062.
A. Yamano, et al., Effects of the heat-treatment conditions on the crystalographic orientation of Pb(Zr1Ti)O3 Thin films Prepared by polyvinylpyrrolidone-assisted sol-gel method, J. M. Ceram. Soc. 90 (12) (2007), pp. 3882-3889.

(Continued)

*Primary Examiner* — Maria Veronica Ewald
*Assistant Examiner* — Nicole T Gugliotta
(74) *Attorney, Agent, or Firm* — Cherskov Flaynik & Gurda LLC

(57) ABSTRACT

The invention provides a process for forming crack-free dielectric films on a substrate. The process comprise the application of a dielectric precursor layer of a thickness from about 0.3 μm to about 1.0 μm to a substrate. The deposition is followed by low temperature heat pretreatment, prepyrolysis, pyrolysis and crystallization step for each layer. The deposition, heat pretreatment, prepyrolysis, pyrolysis and crystallization are repeated until the dielectric film forms an overall thickness of from about 1.5 μm to about 20.0 μm and providing a final crystallization treatment to form a thick dielectric film. Also provided was a thick crack-free dielectric film on a substrate, the dielectric forming a dense thick crack-free dielectric having an overall dielectric thickness of from about 1.5 μm to about 20.0 μm.

7 Claims, 6 Drawing Sheets

(56) References Cited

OTHER PUBLICATIONS

Z. H. Du, et al., "Densification of the PLZT Films Derived from Polymer-Modified Solution for Tailoring Annealing Conditions," J. Am. Ceramic Society 90 (3), (2007), pp. 815-820.

B. Ma, et al., Chemical solution deposition of ferroelectric lead lanthanum zirconate titanate films on base-metal foils J Electroceram (2009), pp. 383-389.

Y. Liu, et al., Nucleation - or Growth-Controlled Orientation Development in Chemically Derived Ferroelectric Lead Zirconate Titanate (Pb(Zr$_x$ Ti$_{1-x}$) O$_3$, x=0.4) Thin Films, J Am Ceram. Sox. 79(2) (1996), pp. 495-498.

Z. H. Du, et al., Effect of polyvinylpyrrolidone on the formation of perovskite phase and rosette-like structure in sol-gel-derived PLZT films, J. Mater. Res., vol. 22 (8) (2007), pp. 2195-2203.

B. Ma, et al., Fabrication and dielectric property of ferroelectric PLZT films grown on metal foils, Materials Research Bulletin 46(7) (2011), pp. 1124-1129.

B. Ma, et al., Dielectric Properties of PLZT film-on-foil capacitors, J.Materials Letters 62 (2008), pp. 3573-3575.

S. Chao et al., Effects of sintering temperature on the microstructure and dielectric properties of titanium dioxide ceramics, J Mater Sci 45 (2010), pp. 6685-6693.

B. Ma, et al., Dielectric strength and reliability of ferroelectric PLZT films deposited on nickel substrates, Materials Letters 63 (2009), pp. 1353-1356.

* cited by examiner

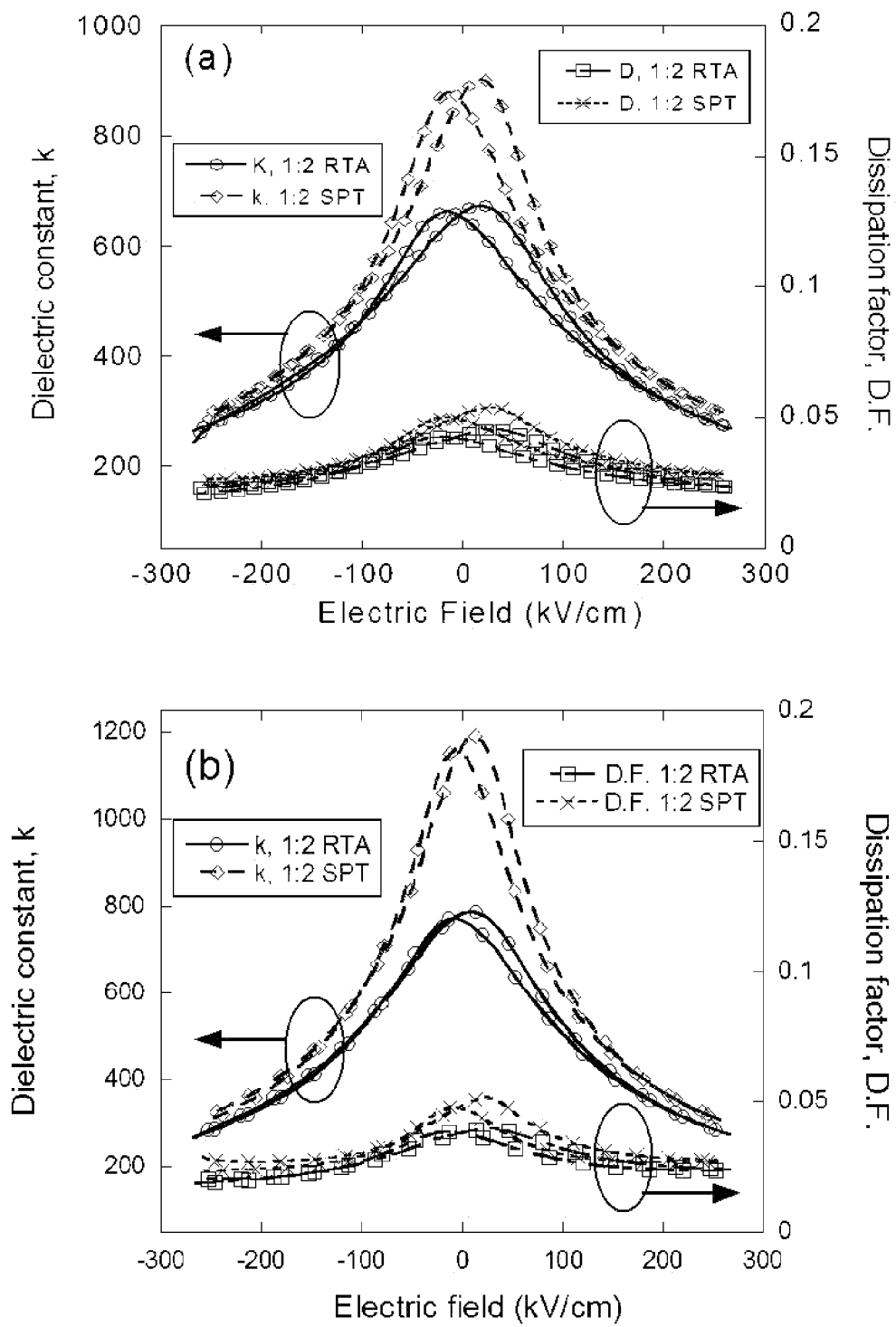
Fig. 3a and b

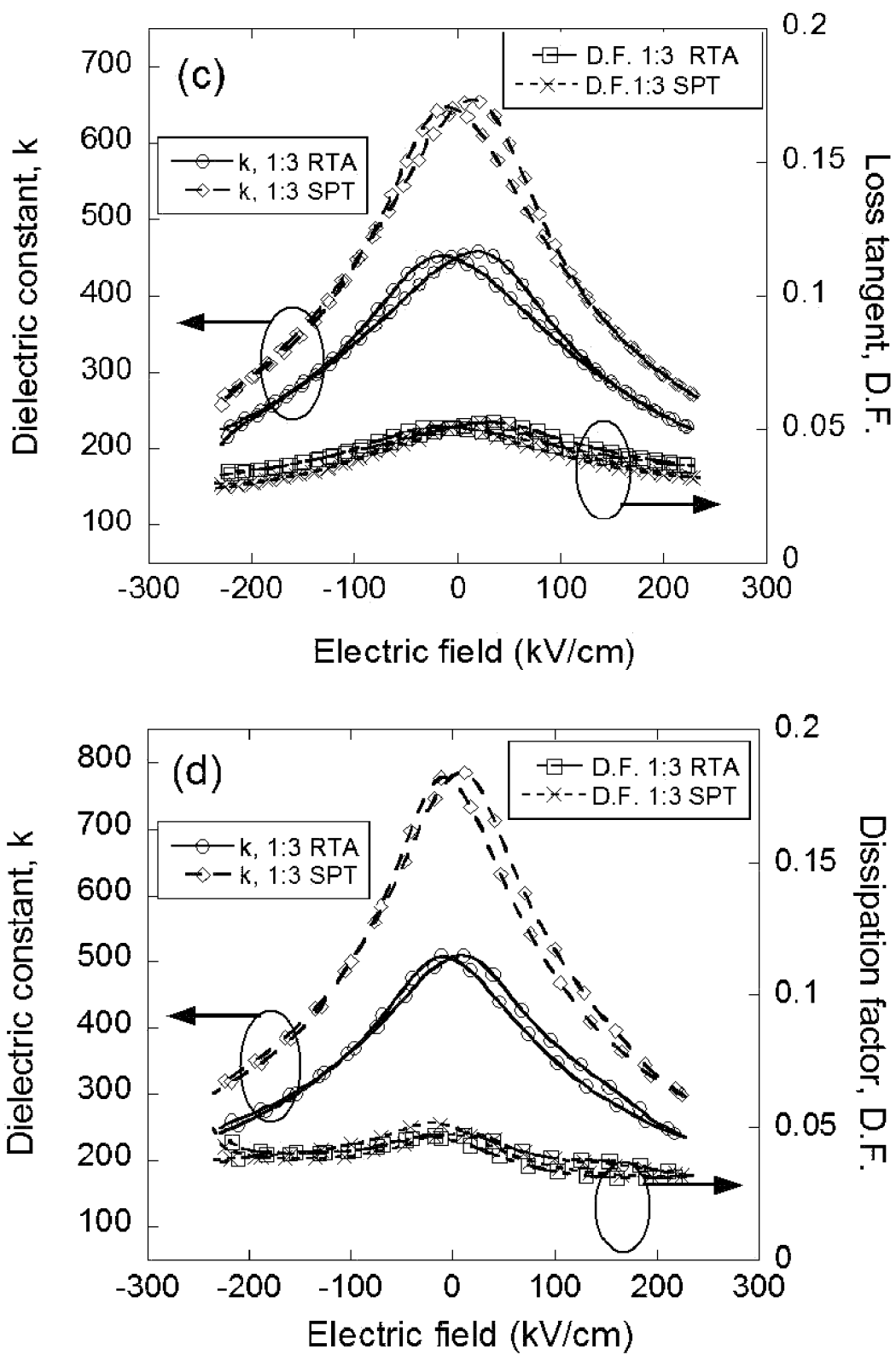
Fig. 3c and d

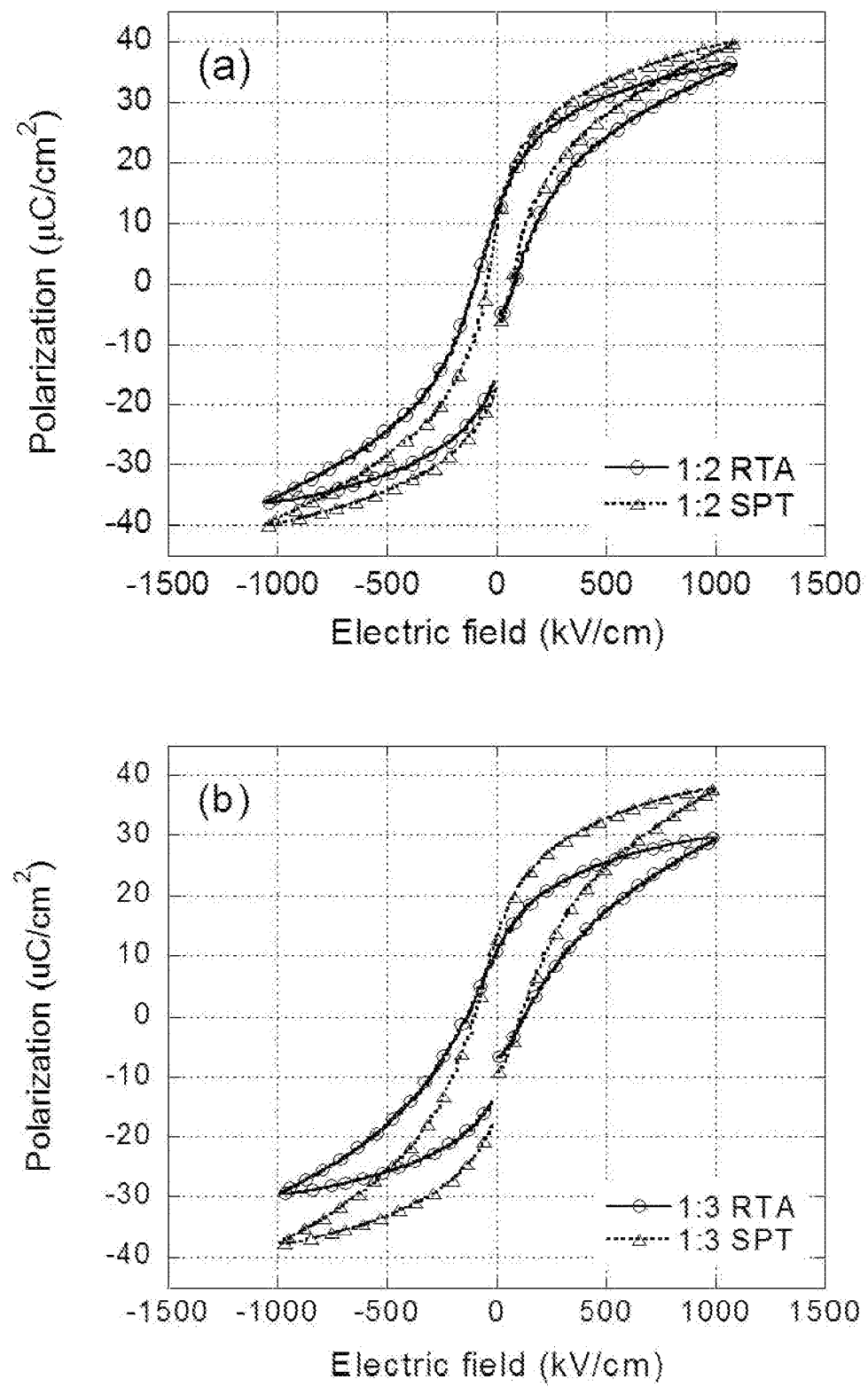
Fig 4a and b

METHOD FOR FABRICATION OF CRACK-FREE CERAMIC DIELECTRIC FILMS

CONTRACTUAL ORIGIN OF THE INVENTION

The U.S. Government has rights in this invention pursuant to Contract No. DE-AC02-06CH11357 between the U.S. Department of Energy and the University of Chicago representing Argonne National Laboratory.

FIELD OF THE INVENTION

The present invention relates to formation of thick ceramic dielectric films. More specifically this invention relates to the formation of thick crack-free ceramic dielectric films, such as lanthanum doped lead zirconate titanate (PLZT) or barium strontium titanate (BST), having an overall thickness of from 1.5 to about 20 µm.

BACKGROUND OF THE INVENTION

The recent need for passive power electronics with improved performance, high reliability, and reduced size and weight, has driven interest in ceramic film on metallic substrates in these applications. The ceramic films on metal foils, known as "film-on-foil" technology, in which ceramic films were deposited on base metal foils for embedding into a printed circuit board. The interest in "film-on-foil" technology exploits ceramic dielectrics, including the important properties, such as ferroelectric, piezoelectric, pyroelectric and electro-optic properties. These properties are utilized in manufacture of nonvolatile semiconductor memories, thin-film capacitors, pyroelectric infrared (IR) detectors, sensors, surface acoustic wave substrates, optical waveguides, and optical memories. Recently, there has been increased interest in applying "film-on-foil" to power electronics, such as capacitors with high capacitance required to work at high voltages. Applying the film-on-foil technology can substantially reduce the production cost and improve the volumetric and gravimetric efficiencies of the capacitors.

Important ferroelectric materials for thin-film applications are typically titanates and niobates with oxygen-octahedral structure types, such as the perovskite structure. Examples of such ferroelectric perovskites include lead titanate ($PbTiO_3$), lead zirconate ($PbZrO_3$), lead zirconate titanate [$Pb(Zr,Ti)O_3$ or PZT], lead lanthanum titanate [$(Pb,La)TiO_3$], lead lanthanum zirconate [$(Pb,La)ZrO_3$], lead lanthanum zirconate titanate [$(Pb,La)(Zr,Ti)O_3$ or PLZT], lead magnesium niobate [$Pb(Mg_{1/3}Nb_{2/3})O_3$], lead zinc niobate [$Pb(Zn_{1/3}Nb_{2/3})O_3$], strontium titanate ($SrTiO_3$), barium titanate ($BaTiO_3$), barium strontium titanate [$(Ba,Sr)TiO_3$], barium titanate zirconate [$Ba(Ti,Zr)O_3$], potassium niobate ($KNbO_3$), potassium tantalate ($KTaO_3$), and potassium tantalate niobate [$K(Ta,Nb)O_3$]. Device applications of ferroelectric thin films require that bulk ferroelectric properties be achieved in thin films. The physical and chemical properties of the film (density, uniformity, stoichiometry, crystal structure, and microstructure) are extremely important. The utilization of ferroelectric thin films for electronic and optical applications has been hindered by the lack of production processes to form deposits of sufficient thickness.

Particular interest has shown that lead lanthanum zirconate titanate ($Pb_{0.92}La_{0.08}Zr_{0.52}Ti_{0.48}O_3$, PLZT) films deposited on nickel or copper foils possessed excellent dielectric properties, which are promising for high power applications such as plug-in hybrid electric vehicles. In power electronics, capacitors with high capacitance are required to work at high voltages, typically in the range of 450 to 600 V. This requirement imposes an additional challenge to fabricate thicker films (>1 µm) that can withstand high voltage. However, in the fabrication process, the deposited films crack easily during heat treatment, due to the well-known critical thickness effect. Due to this effect per-layer thickness that can be achieved by conventional sol-gel methods is generally limited to about 0.2 µm, thus making these methods unattractive to industry if thicker films are needed.

It has been reported that the critical thickness of lead zirconate titanate (PZT) films can be substantially increased by introducing polyvinylpyrrolidone (PVP) into sol-gel solutions (H. Kozuka and S. Takenaka, J. Am. Ceram. Soc. 85 (11) (2002) 2696-2702) and barium titanate (H. Kozuka and M. Kajimura, J. Am. Ceram. Soc. 83 (5) (2000)1056-1062). The increased critical thickness of the PZT dielectric is attributed to the structural relaxation effect as PVP suppressed the condensation reaction because of the strong hydrogen bonds between the amide groups of PVP and the hydroxyl groups of the metalloxane polymers (H. Kozuka and M. Kajimura, J. Am. Ceram. Soc. 83 (5) (2000)1056-1062). However, thick films derived from PVP-containing solutions were generally found to be porous due to the thermal decomposition of PVP during heating (A. Yamano and H. Kozuka, J. Am. Ceram. Soc. 90 (12) (2007)). Pyrolysis temperature had been shown to have a significant impact on microstructure of the films derived from PVP-modified sol-gel process (Z. H. Du, J. Ma, and T. S. Zhang, J. Am. Ceram. Soc. 90 (3) (2007)).

The efficient removal of decomposition byproducts produced by processing aids during dielectric fabrication and the consolidation of the film raises significant processing issues.

SUMMARY OF INVENTION

An object of the invention is to provide a thick dielectric film having and a method for forming overcomes many of the disadvantages of the prior art films.

Another object of the present invention is to provide a process for the manufacture of a crack-free ceramic film having an overall/final thickness from 1.5 µm to about 20.0 µm. In an embodiment the overall thickness is from about 2.0 µm to 10.0 µm. In another embodiment the overall thickness is from about 2.0 µm to 5.0 µm. A feature of the invention is to provide a heat treatment process that reduces stresses brought about differences in thermal expansion in the formation of thick dielectric films. An advantage of the invention is to permit the placement of multiple layers to form a dielectric with a substantial thickness without formation of thermal stress cracks.

Another object of the present invention is to provide a process for the manufacture dense dielectric ceramic film. A feature of the invention is a process that permits coalescence of a dielectric and the reduction of void space. An advantage of the invention is the formation of a ceramic having reduced voids thereby forming a continuous dense material.

Another object of the present invention is to provide a process, the method for forming a dielectric ceramic having a higher dielectric constant compared to materials fabricated by typically processing methods. A feature of the invention is to provide a heating process that efficiently removes most of the processing component that would normally lower the dielectric constant of the final film. An advantage of the invention is the formation of dense ceramic containing fewer forming aids that lower the dielectric constant of the dielectric film.

In brief, the invention provides a process for forming crack-free dielectric films on a substrate, the process comprising the application of a dielectric precursor layer to a substrate, low temperature heat pretreatment, staged prepyrolysis, pyrolysis and crystallization step for each layer, repeated until the dielectric film forms a total or overall thickness of from about 1.5 μm to about 20.0 μm and providing a final crystallization treatment to form a thick dielectric film. In an embodiment of the invention, the total thickness is from about 2.0 μm to about 10.0 μm on a substrate (preferably 2.0 μm to about 5.0 μm). Also provided was a thick crack-free dielectric film on a substrate, the dielectric forming a dense thick crack-free dielectric having an overall dielectric thickness of from about 1.5 μm to about 20.0 μm.

The invention provides a process for forming a crack-free dielectric, the process includes providing a substrate and providing a dielectric precursor soluble gel solution. An initial dielectric precursor sol-gel layer having a thickness from about 0.3 μm to about 1.0 μm is deposited on a substrate. The first dielectric precursor sol-gel layer is heated at a low temperature preheat from about 100° C. to about 200° C. for a period of from about 1 minute to about 30 minutes. In an embodiment of the invention temperature preheat from about 100° C. to about 180° C. The temperature is increased to a prepyrolysis (or low temperature pyrolysis) at a temperature from about 275° C. to about 325° C. in a prepyrolysis step and maintained at the prepyrolysis temperature for a prepyrolysis period of time. In an embodiment, the prepyrolysis temperature is from about 285° C. to about 315° C. The temperature is then increased to a first pyrolysis temperature from about 375° C. to about 425° C. and maintained for a first pyrolysis period of time. The temperature is then increased to a second pyrolysis temperature from about 425° C. to about 475° C. in a second pyrolysis step and maintained at the temperature at the second pyrolysis temperature for a second pyrolysis period of time. The temperature is then raised to a crystallization temperature of from about 600° C. to about 800° C. for a period of time to crystallize at least one layer. The deposition step, initial heating step, pyrolyzing steps and crystallization step are repeated to form a dielectric precursor layer having a total thickness from about 1.5 μm to about 20.0 μm on a substrate. In an embodiment of the invention, the total thickness of the dielectric film is 2.0 μm to about 10.0 μm on a substrate. In one embodiment the total thickness from about 2.0 μm to about 5.0 μm. In one embodiment of the invention a final densification heating step wherein the substrate and the dielectric precursor are heated to crystallize the dielectric precursor at a temperature from about 600° C. to about 800° C. for a final crystallization of time to form crystallized dielectric layer. In another embodiment of the invention, a final densification heating step wherein the substrate and the dielectric precursor are heated to crystallize the dielectric precursor at a temperature from about 650° C. to about 750° C. for a final crystallization of time to form crystallized dielectric layer. Preferably, the process forms a dielectric film layer having a total thickness from about 1.5 μm to about 20 μm on a substrate. In one embodiment of the invention the process forms a dielectric layer having a total thickness from about 2.0 μm to about 10 μm (preferably from about 2.0 μm to about 5.0 μm). The step-wise preheat treatment (SPT) produces a dielectric film producing superior electrical properties over dielectric films produce by the conventional rapid thermal annealing (RTA) process. In the RTA process, films placed in an alumina boat were directly inserted into a tube furnace preheated at 450° C. In the SPT process, films were preheated at 300° C. for 5 min, then 400° C. for another 5 min, and finally at 450° C. for 10 min (by moving the film into different hot zones with designated temperatures in an electric furnace).

In an embodiment of the invention, the low temperature heating time is from about 2 minutes to about 10 minutes. In another embodiment of the invention, the prepyrolysis, first and second pyrolysis times are from about 4 to about 10 minutes. Still, in another embodiment of the invention, the final crystallization time for the process is from about 5 to about 40 minutes. In another embodiment of the invention, the final crystallization time is from about 10 minutes to about 20 minutes. The process can be used to for a dielectric layer from any dielectric film forming material; preferably selected from lanthanum doped lead zirconate titanate soluble gel solution (PLZT sol-gel) or a barium strontium titanate (BST). The substrate can be any suitable substrate, such as a silicon wafer, a platinized silicon wafer, a base metal (nickel, copper, iron or chromium) or an alloy of a base metal (Hastelloy C or Inconel 625).

BRIEF DESCRIPTION OF DRAWING

The invention together with the above and other objects and advantages will be best understood from the following detailed description of the preferred embodiment of the invention shown in the accompanying drawings, wherein:

FIG. 3. Dielectric constant (k) and dissipation factor (D.F.) of the PLZT films as a function of bias field: (a) PLZT:PVP=1:2, 20° C.; (b) PLZT:PVP=1:2, 150° C.; (c) PLZT:PVP=1:3, 20° C.; and (d) PLZT:PVP=1:3, 150° C.

FIG. 4. Hysteresis loops of the PLZT films at room temperature: (a) PLZT:PVP=1:2 and (b) PLZT:PVP=1:3.

DETAILED DESCRIPTION OF THE INVENTION

Figure 1:
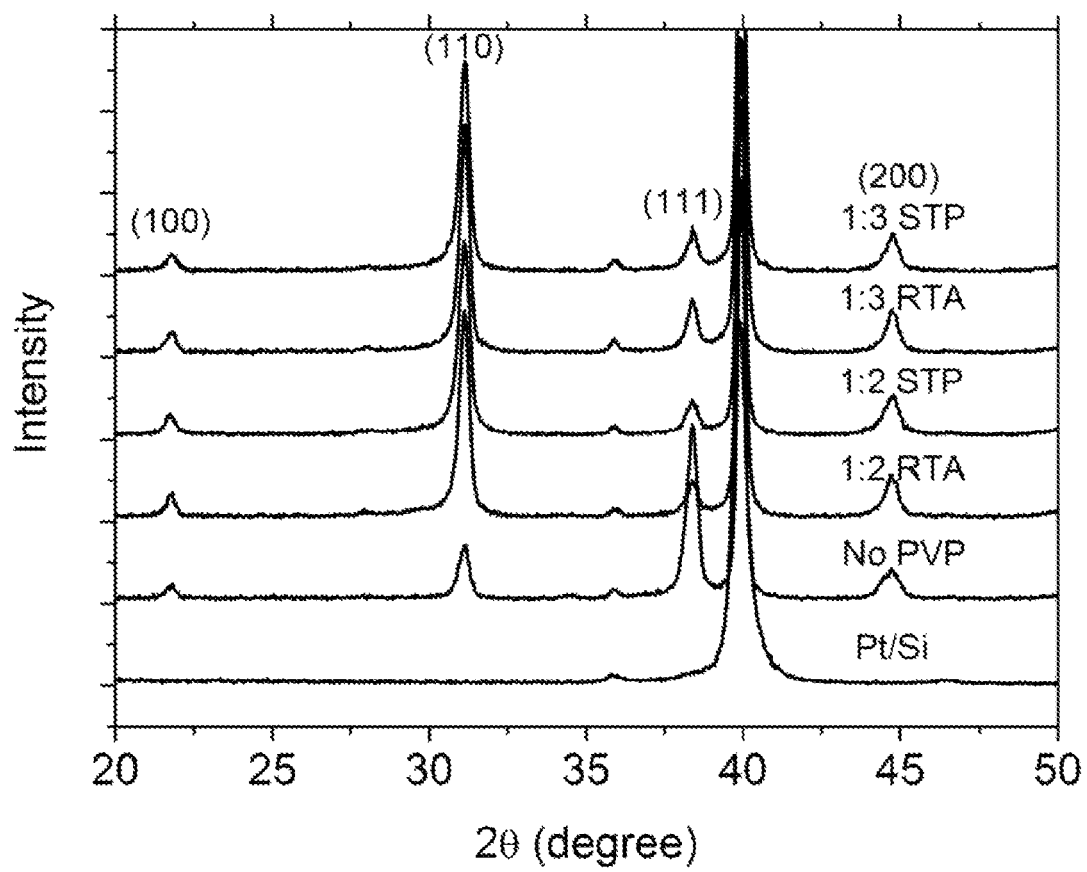
FIG. 1 is an XRD profile of the PLZT films prepared by the SPT and RTA with different PLZT: PVP ratios.

The foregoing summary, as well as the following detailed description of certain embodiments of the present invention, will be better understood when read in conjunction with the appended drawings.

As used herein, an element or step recited in the singular and preceded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Dielectric films are used in electrical components, particularly capacitors, to inhibit/control the flow of electricity for power management applications. In power electronics applications, such as electric vehicles, capacitors with high capacitance are required to operate at voltages in excess of 100 volts (V). In one embodiment of the invention, capacitors formed from the process of the invention operate at voltages in excess of 50 volts. Typically, this would require a material with a dielectric constant (κ)≈1000 at zero bias. This requirement imposes an additional challenge to fabricate thicker films in the range of 1.5 μm to 20 μm, while providing a film substantially free from cracks and voids. To achieve this objective the film must form a dense layer substantially free from defects and cracks. The use of processing additives, such as polyvinylpyrrolidone (PVP)—increase the viscosity of the coating solution. The use of the viscosity modifiers raises additional processing issues in the efficient removal of processing aids and modifiers to form a dense dielectric film on a substrate. To realize this goal the inventors have developed a dielectric/support curing process for the fabrication of dense crack-free dielectrics while reducing the overall fabrication time.

The inventors have developed a dielectric fabrication process for the formation of a thick dense dielectric substantially free from voids and cracks that reduce the dielectric constant of the film. Further the invented process reduces cracking of the dense film thereby significantly reducing the leakage current density (A/cm$^2$) and improving the dielectric breakdown strength of the film. The invented process effectively fuses/melds multiple layers, thereby consolidating the dense film into one continuous film, while significantly reducing cracks/fractures.

The invention provides a process for forming crack-free dielectric films on a substrate. A dielectric precursor layer is applied to a substrate. Initially, the precursor is heated in low temperature heat pretreatment step, followed by prepyrolysis, pyrolysis (in two stages) and crystallization step for each layer. The, steps of deposition, low temperature heat pretreatment, staged prepyrolysis, pyrolysis and crystallization are repeated until the dielectric film forms an overall thickness of from about 1.5 μm to about 20.0 μm and providing a final crystallization treatment to form a thick dielectric film. In an embodiment of the invention the total thickness is from about 2.0 μm to about 10 μm. Also provided was a thick crack-free dielectric film on a substrate, the dielectric forming a dense thick crack-free dielectric having an overall dielectric thickness of from about 1.5 μm to about 20.0 μm. Surprisingly the inventors have discovered that the invented process produces a dense film having substantially fewer racks and voids. The inventors have discovered that the invented process increases the dielectric constant of the film by approximately 50% above the dielectric constant produced from the process of the invention. This surprising increase in the dielectric constant combined with a reduced dissipation factor (DF) for dielectric films produced by the invention provides a dielectric film providing increase performance.

Experimental Procedure

PLZT precursor solutions of 0.6 M concentration were prepared by a modified 2-methoxyethanol synthesis route by using following raw materials: 99% lead acetate tri-hydrate, 97% titanium isopropoxide, 70% zirconium n-propoxide in 1-propanol, and 99.9% lanthanum acetate hydrate (all from Sigma-Aldrich Co.). The solution contains 20% excess lead to compensate for the loss during treatment. To form the chemical solution for deposition, PVP (PVP10, Sigma-Aldrich Co., with an average molecular weight of 10,000 g/mol) was added to the PLZT stock solution in PLZT:PVP=1:2 and 1:3 molar ratio (PVP is defined by its monomer). The PVP-added PLZT solution was aged for approximately 12 h before coating. The aged solution, after passing through a 0.2-μm syringe filter, was deposited on a substrate by means of a spin coater (Laurell Technologies, North Wales, Pa.) at 2000 rpm for 30 sec. The substrate was a platinized silicon wafer with ≈100-nm thick Pt layer (Nova Electronic Materials, Flower Mound, Tex.). After deposition the films were first preheated at 100° C. to 200° C. for 1 to 30 min in a furnace. Then, the films were subjected to two different pyrolysis processes: rapid thermal annealing (RTA) and step-wise preheat treatment (SPT). In the RTA process, films placed in an alumina boat were directly inserted into a tube furnace preheated at 450° C. for 10 min. In the SPT process, films were preheated at 300° C. for 5 min, then 400° C. for another 5 min, and finally at 450° C. for 10 min (by moving the film into different hot zones with designated temperatures in an electric furnace). After pyrolysis, all films were crystallized at 650° C. for 10 min. The deposition, pyrolysis, and crystallization steps were repeated to build up a thickness to about 1.6 μm for all samples; in order to avoid the possible thickness effect on dielectric properties. Final crystallization and densification were conducted at 650° C. for 30 min. All heat treatments were performed in ambient atmosphere.

Platinum (100-nm thickness) was deposited on samples through a shadow mask by electron-beam evaporation as top electrodes. Samples with Pt top electrodes were annealed at 450° C. in air for 5 min for electrode conditioning. A Signatone QuieTemp® probe system with heatable vacuum chuck (Lucas Signatone Corp., Gilroy, Calif.) was used for dielectric property characterization. Phase identification was conducted by using a Bruker D8 AXS diffractometer with General Area Detector Diffraction System. Microstructure observation was performed with a Hitachi S4700 field-emission scanning electron microscope (SEM). An Agilent E4980A Precision LCR Meter was used to measure capacitance and dissipation factor at an applied bias field. Then, dielectric constant was calculated with the diameter of the electrode (250-μm diameter electrode was used for all electrical tests) and the thickness of the film. Hysteresis loops were measured by using a Radiant Technologies Precision Premier II tester using a field sweeping frequency of 1 kHz. Breakdown strength and current-voltage characteristics were measured by using a Keithley 237 high-voltage source meter.

FIG. 1 shows XRD patterns of the PLZT films prepared by SPT- and RTA-process with PLZT:PVP ratios of 1:2 and 1:3. For comparison, XRD pattern of a PLZT sample prepared with the same PLZT stock solution but without PVP is also included. (111) preferential orientation was observed for this sample; however, all the other samples with PVP showed a random orientation, with (110) as the most intense peak. The (111) preferential orientation was attributed to the lattice matching between the (111)-oriented Pt substrate and the PLZT film, while the absence of this orientation is likely related to the PVP decomposition. Yamano and Kozuka believed that orientation became difficult in PZT films derived from the solution containing PVP due to the large number of nucleation sites provided by the porosity. Except for this difference, all samples are phase-pure perovskite without any detectable secondary phases, such as pyrochlore.

Figure 2:
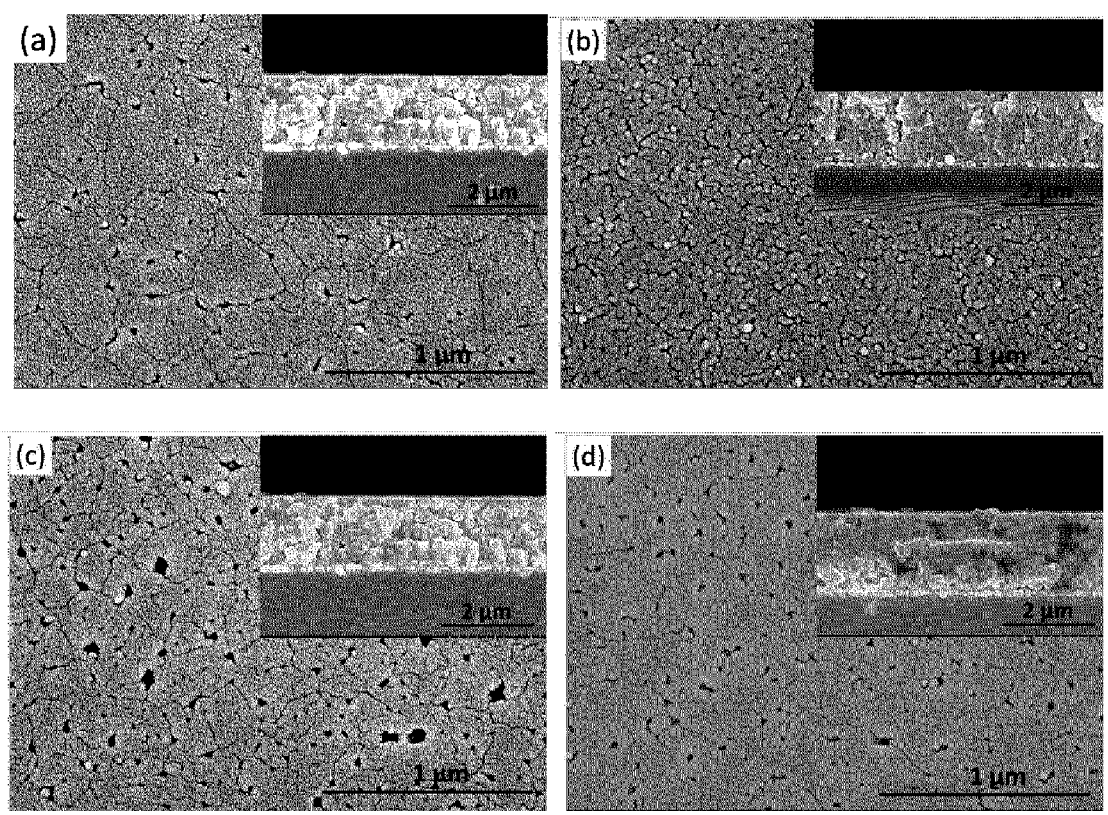
FIG. 2. SEM images showing the surface and cross-sectional (insets) morphology of the PLZT films: (a) RTA, PLZT:PVP=1:2; (b) SPT, PLZT:PVP=1:2; (c) RTA, PLZT:PVP=1:3; and (d) SPT, PLZT:PVP=1:3.

Film thickness was determined from the SEM cross-sectional images (FIG. 2). The thicknesses of the PLZT films after 5 or 6 deposition cycles were in the range of 1.5-1.7 μm, corresponding to per-layer thickness of ≈266 nm and ≈340 nm for solutions with PLZT:PVP=1:2 and 1:3 ratio, respectively. The SEM cross-sectional image for the RTA process is shown in FIG. 2(*a*) (1:2 ratio) and 2(*c*) (1:3 ratio). The SEM cross-sectional image for the inventors' SPT process is shown in FIG. 2(*b*) (1:2 ratio) and 2(*d*) (1:3 ratio). The film thickness was not influenced by the pyrolysis methods. The relatively low per-layer thickness is due to the low molecular weight PVP used in the present study, as layer thickness is mainly determined by viscosity of the solution. The inventors did not observe the so-called "rosette" structure, which is common in Pb-containing ferroelectric films derived from polymer [PVP or poly(ethylene glycol)]-modified sol-gel solutions (Z. H. Du and T. S. Zhang, and J. Ma, J. Mater. Res. 22 (8) (2007) 2195-2203).

The inventors observed two trends in the examination of the surface morphology of the films. First, the number of the pores and their size increased with increasing PVP addition. Second, for samples prepared from the same solution (same PVP content), pore sizes were smaller in the SPT-treated samples. The more PVP added, the more polymer was burned out eventually; therefore, it is reasonable to expect more residual pores left in the films prepared from the solution with high PVP content. The inventors observe that, although the final pyrolysis temperature was the same (450° C.), films treated with additional thermal heating steps at lower temperatures demonstrated a higher degree of integrity. Previous research showed that PVP starts to decompose to carbonaceous species in the temperature range of 250-320° C., and the carbonaceous species are oxidized at ≈360-460° C. (H. Kozuka and S. Takenaka, J. Am. Ceram. Soc. 85 (11) (2002) 2696-2702). Therefore, we hypothesized that additional heating stages at 300° C. and 400° C. would assist PVP to decompose in a gradual manner, preventing it from directly decomposing into gaseous species in a violent manner, which likely causes the formation of large pores and even cracks.

FIG. 3 plots dielectric constant and dissipation factor as a function of applied bias field for the SPT- or RTA-treated samples with PLZT:PVP=1:2 and 1:3; The properties were measured at 20° C. and 150° C. The SPT-treated samples have much higher dielectric constant than the RTA-treated samples processed under similar conditions. The inventors observed the dielectric constant for the SPT-treated vs. the RTA-treated samples increases by ≈38% and ≈50% at 20° C. (FIG. 3a) and 150° C., (FIG. 3b) respectively, for the PLZT:PVP=1:2 solution, and it increases by ≈44% and ≈56% at 20° C. (FIG. 3c) and 150° C. (FIG. 3d), respectively, for the PLZT:PVP=1:3 solution. For samples derived from the solutions with a given PLZT to PVP ratio, since XRD analysis did not reveal any preferred crystallographic orientation and secondary phase. The inventors believe that the difference in dielectric constant is attributed to the difference in microstructures as a result of the different pyrolysis conditions. Furthermore, dielectric constant for both the SPT- and the RTA-treated samples drops rapidly with the increase of the PVP content in the precursor solution. As shown in FIG. 2, samples with various PVP contents and pyrolyzed in different ways exhibited different microstructures. In general, SPT-treated samples with less PVP content (FIGS. 2a and 2b) exhibited a denser microstructure, and these samples thus showed higher dielectric constant. The dielectric constant values of the RTA-treated samples with PLZT:PVP=1:2 are close to those of PLZT films deposited by an acetic-acid-based sol-gel process without PVP addition [1]. Dissipation factor of these samples is about 5-6% at room temperature, and it decreased slightly to 4-5% at 150° C., which is also at the same level as our previous results.

FIG. 4 shows polarization-electric field (P-E) hysteresis loops of the PLZT films measured at room temperature. A high electric field up to 1000 kV/cm was applied. In general, all films show a relatively slim hysteresis loop, which is desirable for energy storage applications, as the area enclosed by the charge and discharge curves represents energy loss. Note that with increasing of PVP content, the shape of the loop starts to become "fatty," it means that a larger portion of the electric energy stored would not be retrievable upon discharge. In addition, we found an increase in average remnant polarization $[P_r=(+P_r-(-P_r))/2]$ and a decrease in average coercive field $[E_c=(+E_c-(-E_c))/2]$ when the pyrolysis process was changed from RTA to SPT for the films derived from the solution with same PLZT:PVP ratio. For the PLZT:PVP=1:2 solution, $P_r$ increased from 13.3 to 13.9 $\mu C/cm^2$, while for the PLZT:PVP=1:3 solution, $P_r$ increased from 12.4 to 14.5 $\mu C/cm^2$. In terms of coercive field, $E_c$ decreased from 83 to 59 kV/cm for the PLZT:PVP=1:2 and from 112 to 91 kV/cm for the PLZT:PVP=1:3 solution. Again, these differences can be explained by the microstructural features.

Figure 5:
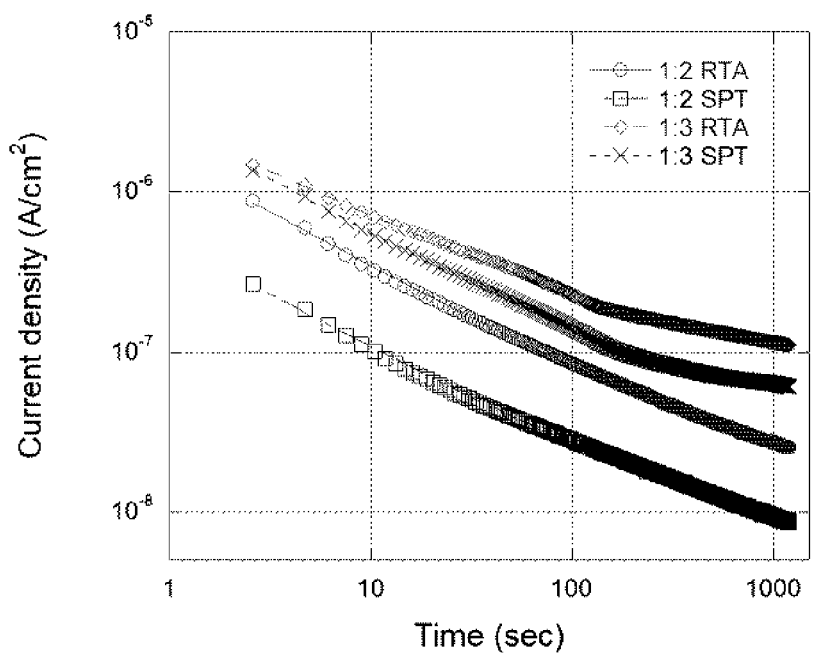
FIG. 5. Current density relaxation of the PLZT films measured at 100 kV/cm at room temperature. Symbols are experimental data and solid lines are the fitting curves.

Time-relaxation data of leakage current density at 100 kV/cm are given in FIG. 5. The decay in dielectric relaxation current obeys Curie-von Schweidler equation (Jonscher, Dielectric Relaxation in Solids, Chelsea Dielectrics Press (1983))

$$J=J_s+J_0 t^{-n} \qquad (1)$$

where $J_s$ is the steady-state current density, $J_0$ is a fitting constant, t is the relaxation time in second, and n is the slope of the log-log plot. The calculated steady-state current densities are listed in table 1.

TABLE 1

Steady-state leakage current densities of the PLZT films.

| Samples | Leakage current density (A/cm$^2$) |
| --- | --- |
| 1:2 RTA | 1.38 × 10$^{-8}$ |
| 1:2 SPT | 5.43 × 10$^{-9}$ |
| 1:3 RTA | 7.20 × 10$^{-8}$ |
| 1:3 SPT | 4.12 × 10$^{-8}$ |

We can see that it follows a logical trend that films with high PVP content and pyrolyzed with the RTA process show higher leakage current. In addition to the microstructural defects that can be used to interoperate this difference, more residual carbon left inside the films with high PVP content and pyrolyzed in a rapid way may also contribute to high leakage current. The leakage current value measured for the SPT-treated sample with PLTZ:PVP=1:2 is close to that of the films deposited on nickel substrates using the same chemical solution but without PVP (B. Ma, D. K. Kwon, M. Narayanan, and U. Balachandran, Mater. Lett. 62 (2008) 3573-3575).

Figure 6:
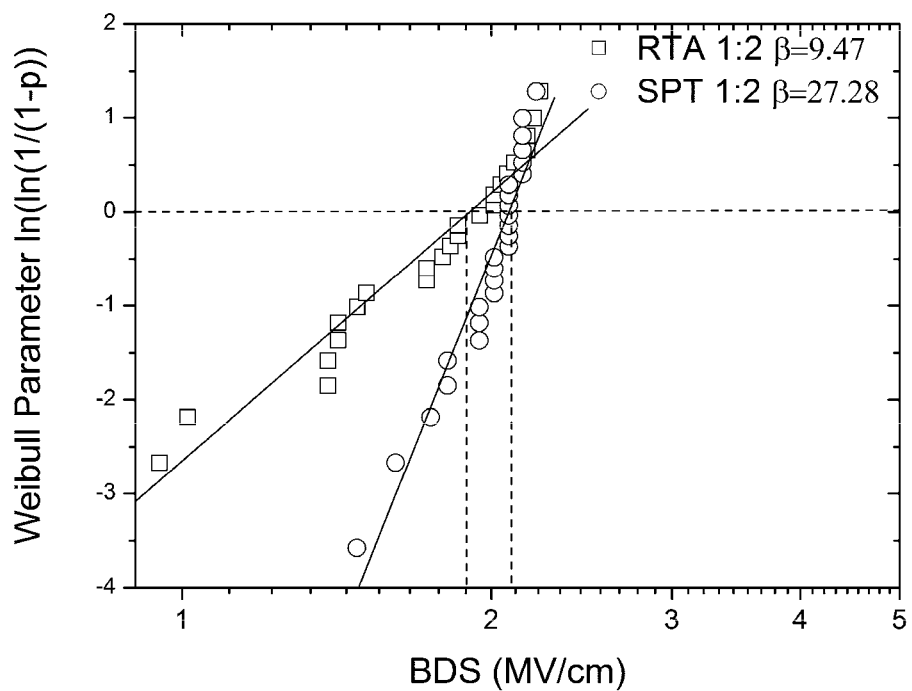
FIG. 6. Weibull plots and corresponding parameters for dielectric breakdown strength of the films derived from the PLZT:PVP=1:2 solution and pyrolyzed by RTA and SPT.

Dielectric breakdown strength (BDS) was measured on 25 samples tested in a top-to-bottom electrode configuration. Failure of the sample was defined by a 1-µA criterion. The BDS data for the films derived from the PLZT:PVP=1:2 solution presented as Weibull plots (B. Ma, D. K. Kwon, M. Narayanan, and U. Balachandran, Mater. Lett. 62 (2008) 3573-3575), (FIG. 6) due to the inherently statistical nature of failure. The samples treated by the SPT process show slightly higher mean BDS (BDS≈2.1 MV/cm) than the samples treated by the RTA process (BDS≈1.9 MV/cm). Furthermore, their Weibull moduli ($\beta$) exhibit a larger difference ($\beta$=9.5 for the RTA sample and $\beta$=27.3 for the SPT sample). Weibull modulus is a measure of distribution of the data: the higher the value of $\beta$, the smaller the variation of the data. Thus, a higher modulus indicates a better representation of the sample-to-sample performance as measured by mean breakdown strength. Here, the higher modulus found in the SPT-treated samples is attributed to their denser microstructure (FIG. 2), as residual porosity (especially so-called "critical flaws" that initiate the breakdown process) is always detrimental to the breakdown strength (S. Chao, V. Petrovsky, and F. Dogan, J. Mater. Sci. 45 (2010) 6685-6693). High breakdown strength, together with small data scattering, is of great importance for ceramic capacitors, as reliability is still one of the biggest concerns for this type of capacitor. Here, we demonstrated that with appropriate control of the pyrolysis conditions, PLZT films with high reliability can be fabricated by a PVP modified sol-gel process.

Generally, the invention provides for a process for forming a high-quality ferroelectric PLZT films were prepared by a modified sol-gel process. Surprising, the step-wise preheat treatment was effective to achieve high quality PLZT films, as it reduced the number and the size of the defects left by the decomposition of sol-gel modifier (PVP). The PLZT films prepared by the SPT process exhibited superior dielectric properties: dielectric constant ≈860, dissipation factor ≈0.06, leakage current ≈$5.4 \times 10^{-9}$ A/cm$^2$, and breakdown strength ≈2.1 MV/cm. These values are comparable to those of the films grown by the sol-gel method without PVP addition. This process is believed to be applicable for fabrication of film-on-foil capacitors with thickness >1 μm and preferably for capacitors with thickness >10 μm, for power electronics.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

While the invention has been particularly shown and described with reference to a preferred embodiment hereof, it will be understood by those skilled in the art that several changes in form and detail may be made without departing from the spirit and scope of the invention.

While the invention has been particularly shown and described with reference to a preferred embodiment hereof, it will be understood by those skilled in the art that several changes in form and detail may be made without departing from the spirit and scope of the invention.

The invention claimed is:

1. A crack-free dielectric comprising:
   a substrate;
   a dielectric layer overlaying the substrate, whereby the layer is formed by depositing a first dielectric precursor sol-gel layer having a thickness from about 0.3 μm to about 1.0 μm on a substrate,
   heating the first dielectric precursor sol-gel layer at a low temperature from about 100° C. to about 200° C. for a low temperature heating time from about 1 minute to about 30 minutes,
   increasing the temperature from about 275° C. to about 325° C. in a prepyrolysis step and maintaining the temperature at the prepyrolysis temperature for a prepyrolysis period of time,
   increasing the temperature from about 375° C. to about 425° C. in a first pyrolysis step and maintaining the temperature at the first pyrolysis temperature for a first pyrolysis period of time,
   increasing the temperature from about 425° C. to about 475° C. in a second pyrolysis step and maintaining the temperature at the second pyrolysis temperature for a second pyrolysis period of time,
   increasing the temperature from about 600° C. to about 800° C. for a period of time to crystallize at least one layer;
   repeating the deposition step, initial heating step, pyrolyzing and crystallization steps to form a dielectric precursor layer having a total thickness from about 1.5 μm to about 20.0 μm on the substrate to form a crystallized dielectric layer.

2. The crack-free dielectric of claim 1 further comprising heating the substrate and the dielectric precursor to crystallize the dielectric precursor at a temperature from about 625° C. to about 675° C. for a final crystallization time to form crystallized dielectric layer.

3. The crack-free dielectric of claim 1 wherein the dielectric precursor is a titanate selected from the group consisting of lanthanum doped lead zirconate titanate soluble gel solution (PLZT sol-gel) containing polyvinylpyrrolidone and a barium strontium titanate (BST) soluble gel solution sol-gel containing polyvinylpyrrolidone.

4. The crack-free dielectric of claim 1 wherein the low temperature heating time is from about 2 minutes to about 10 minutes.

5. The crack-free dielectric of claim 1 wherein the deposition step, initial heating step, pyrolyzing and crystallization steps are repeated to form a dielectric precursor layer having a thickness from about 2.0 μm to about 5.0 μm on a substrate.

6. The crack-free dielectric of claim 2 wherein the final crystallization time is from about 10 to about 40 minutes.

7. The crack-free dielectric of claim 1 wherein the substrate is selected from the group consisting of silicon, a platinized silicon wafer and a base metal.

* * * * *